United States Patent
Cheng et al.

(10) Patent No.: US 10,147,744 B2
(45) Date of Patent: Dec. 4, 2018

(54) ARRAY SUBSTRATE, METHOD OF MANUFACTURING THE SAME, AND DISPLAY DEVICE

(71) Applicant: BOE TECHNOLOGY GROUP CO., LTD., Beijing (CN)

(72) Inventors: Hongfei Cheng, Beijing (CN); Jianbo Xian, Beijing (CN); Pan Li, Beijing (CN); Xueguang Hao, Beijing (CN)

(73) Assignee: BOE TECHNOLOGY GROUP CO., LTD. (CN)

( * ) Notice: Subject to any disclaimer, the term of this patent is extended or adjusted under 35 U.S.C. 154(b) by 0 days.

(21) Appl. No.: 15/525,622

(22) PCT Filed: Jun. 3, 2016

(86) PCT No.: PCT/CN2016/084702
§ 371 (c)(1),
(2) Date: May 10, 2017

(87) PCT Pub. No.: WO2017/166428
PCT Pub. Date: Oct. 5, 2017

(65) Prior Publication Data
US 2018/0108676 A1  Apr. 19, 2018

(30) Foreign Application Priority Data

Mar. 30, 2016 (CN) ..................... 2016 2 0257716 U

(51) Int. Cl.
*H01L 27/12* (2006.01)
*G02F 1/1362* (2006.01)
(Continued)

(52) U.S. Cl.
CPC .......... *H01L 27/124* (2013.01); *G02F 1/1362* (2013.01); *G02F 1/1368* (2013.01);
(Continued)

(58) Field of Classification Search
CPC ............... H01L 27/124; H01L 27/1251; H01L 27/1259; G02F 1/1362–1/1368
See application file for complete search history.

(56) References Cited

U.S. PATENT DOCUMENTS 6,069,019 A  *  5/2000  Ishii ................... G02F 1/13458
                                                             438/30
9,190,558 B2  11/2015  Tsai et al.
(Continued)

FOREIGN PATENT DOCUMENTS

CN  101236975 A  8/2008
CN  103792746 A  5/2014
(Continued)

OTHER PUBLICATIONS

Search Report for International Patent Application No. PCT/CN2016/084702 dated Dec. 20, 2016.

*Primary Examiner* — Stephen Bradley
(74) *Attorney, Agent, or Firm* — Calfee, Halter & Griswold LLP

(57) ABSTRACT

An array substrate, a method of manufacturing the same, and a display device are provided. In the array substrate of the present disclosure, the gate cutout is formed in the area where the gate line intersects the data line. The array substrate can reduce the coupling capacitance between the data line and the gate line. When the gate cutout extends beyond the area between the first thin film transistor and the second thin film transistor, the mutual interference between two thin film transistors of each pixel region can be further reduced.

14 Claims, 7 Drawing Sheets

(51) Int. Cl.
*G02F 1/1368* (2006.01)
*H01L 27/32* (2006.01)
*H01L 29/786* (2006.01)
*H01L 33/00* (2010.01)
*H01L 51/52* (2006.01)

(52) U.S. Cl.
CPC .... *G02F 1/136286* (2013.01); *H01L 27/1222* (2013.01); *H01L 27/3276* (2013.01); *H01L 29/7869* (2013.01); *H01L 33/0041* (2013.01); *H01L 51/5284* (2013.01)

(56) References Cited

U.S. PATENT DOCUMENTS

| | | | |
|---|---|---|---|
| 9,876,039 B2* | 1/2018 | Hirano | H01L 29/786 |
| 2006/0091389 A1* | 5/2006 | Jun | H01L 27/12 257/59 |
| 2009/0195489 A1* | 8/2009 | Hung | G02F 1/136286 345/92 |
| 2009/0268119 A1* | 10/2009 | Lee | G02F 1/136259 349/54 |
| 2016/0005767 A1 | 1/2016 | Shen | |
| 2016/0035751 A1 | 2/2016 | Tsai et al. | |
| 2016/0291367 A1* | 10/2016 | Cheng | G02F 1/1368 |

FOREIGN PATENT DOCUMENTS

| | | | | |
|---|---|---|---|---|
| CN | 204065625 U | * | 12/2014 | ........... G02F 1/1368 |
| CN | 104280969 A | | 1/2015 | |
| CN | 105182646 A | | 12/2015 | |

* cited by examiner

ARRAY SUBSTRATE, METHOD OF MANUFACTURING THE SAME, AND DISPLAY DEVICE

CROSS-REFERENCE TO RELATED APPLICATIONS

The present application is based upon International Application No. PCT/CN2016/084702, filed on Jun. 3, 2016, which is based upon claims priority to Chinese Patent Application No. 201620257716.4, filed Mar. 30, 2016, the entire contents of which are incorporated herein by reference.

TECHNICAL FIELD

The present disclosure pertains to the field of display technology, and more particularly to an array substrate, a method of manufacturing the same, and a display device.

BACKGROUND

Currently, liquid crystal display technology has been widely used in devices such as televisions, mobile phones, computers, public information display screens and the like. The conventional liquid crystal display panel comprises an array substrate comprising a data line and a gate line which are vertically intersected, and a plurality of pixel regions, a thin film transistor and a pixel electrode are provided in each pixel region, a gate electrode of the thin film transistor is electrically connected to a gate line, a drain electrode of the thin film transistor is electrically connected to the pixel electrode, and a source electrode of the thin film transistor is electrically connected to a data line, such that the thin film transistor can be driven by the data line and the gate line, and a data signal is written into the pixel electrode.

In the prior art, in order to realize a liquid crystal display having a wide viewing angle, two pixel electrodes are usually provided in each pixel region, and two pixel electrodes are respectively driven by two thin film transistors.

The inventor has found that at least the following problems exist in the prior art: in an area where the data line overlaps the gate line, coupling capacitance will be generated between the data line and the gate line, such that crosstalk is generated between the data line and the gate line, resulting in uneven image display; and two thin film transistors of each pixel region interfere with each other, resulting in lower image quality.

It should be noted that, information disclosed in the above background portion is provided only for better understanding of the background of the present disclosure, and thus it may contain information that does not form the prior art known by those skilled in the art.

SUMMARY

The present disclosure provides an array substrate, a method of manufacturing the same, and a display device.

The technical solution employed by the present disclosure is an array substrate comprising a substrate, a gate line, a data line and a plurality of pixel regions, a first pixel electrode and a second pixel electrode are disposed in the pixel region, and the first pixel electrode and the second pixel electrode are oppositely disposed at two sides of the gate line corresponding to the pixel region and are electrically insulated from each other; a first thin film transistor and a second thin film transistor are also disposed in the pixel region, the data line is electrically connected to the first pixel electrode through the first thin film transistor, the data line is electrically connected to the second pixel electrode through the second thin film transistor, and a gate electrode of the first thin film transistor and a gate electrode of the second thin film transistor are respectively positioned at the two sides of the gate line corresponding to the pixel region and are disposed to be opposite to each other, wherein a gate cutout is disposed in an area of the gate line intersecting the data line.

The present disclosure provides another technical solution, i.e. a display device, comprising the array substrate described as above.

The present disclosure provides a manufacturing method of a array substrate, comprising a step of sequentially forming a gate line, a data line and a plurality of pixel regions on a substrate, wherein a first pixel electrode and a second pixel electrode are disposed in the pixel region, and the first pixel electrode and the second pixel electrode are oppositely disposed at two sides of the gate line corresponding to the pixel region and are electrically insulated from each other; a first thin film transistor and a second thin film transistor are also disposed in the pixel region, the data line is electrically connected to the first pixel electrode through the first thin film transistor, the data line is electrically connected to the second pixel electrode through the second thin film transistor, and a gate electrode of the first thin film transistor and a gate electrode of the second thin film transistor are respectively positioned at the two sides of the gate line corresponding to the pixel region and are disposed to be opposite to each other, wherein, the manufacturing method of the array substrate further comprises a step of: forming a gate cutout in an area of the gate line intersecting the data line.

It is to be understood that both the foregoing general description and the following detailed description are exemplary and explanatory only and are not restrictive of the invention, as claimed.

This section provides a summary of various implementations or examples of the technology described in the disclosure, and is not a comprehensive disclosure of the full scope or all features of the disclosed technology.

DETAILED DESCRIPTION

In order that those skilled in the art will better understand the technical solutions of the present disclosure, the present disclosure will be described in further detail with reference to the accompanying drawings and specific implementations.

First Embodiment

The present embodiment provides an array substrate. In the array substrate, a gate line is provided with a gate cutout in an area intersecting a data line along an extending direction of the gate line, such that coupling capacitance between the data line and the gate line can be reduced, thus crosstalk between the data line and the gate line is reduced.

Figure 1A:
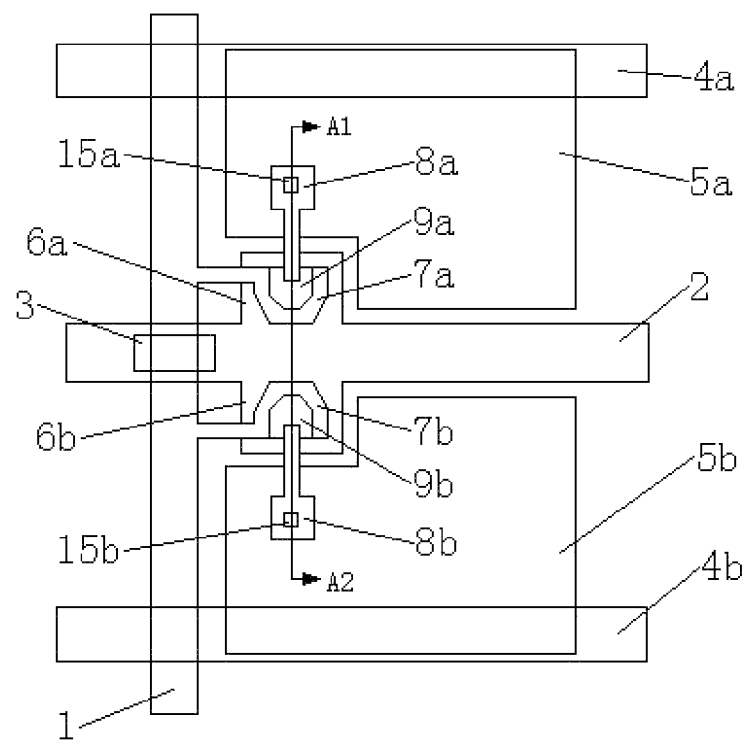
FIG. 1A is a schematic structural view of one pixel region in an array substrate according to a first embodiment of the present disclosure.
Figure 2:
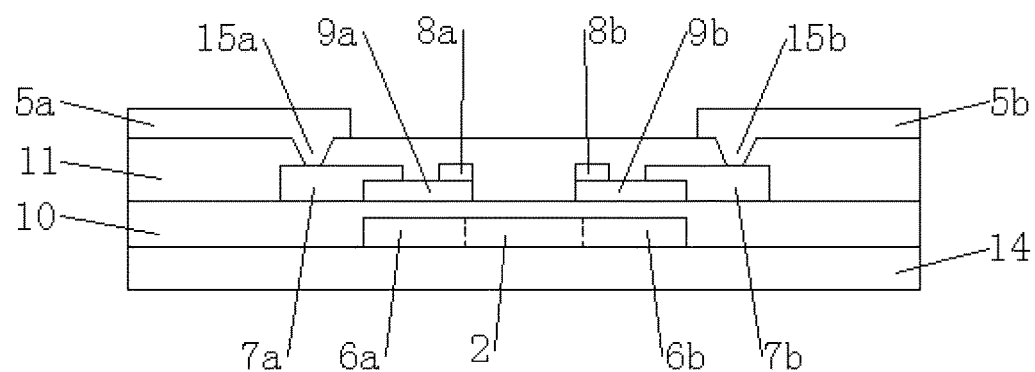
FIG. 2 is a cross-sectional view taken along a line A1-A2 in FIG. 1A.

FIG. 1A is a schematic structural view of one pixel region in an array substrate according to the present embodiment, and FIG. 2 is a cross-sectional view taken along a line A1-A2 in FIG. 1A. As shown in FIGS. 1A and 2, the array substrate comprises a substrate 14, a gate line 2, a data line 1 and a plurality of pixel regions. A first pixel electrode 5*a* and a second pixel electrode 5*b* are disposed in the pixel region, and the first pixel electrode 5*a* and the second pixel electrode 5*b* are oppositely disposed at two sides of the gate line 2 corresponding to the pixel region and are electrically insulated from each other. A first thin film transistor and a second thin film transistor are disposed in each pixel region. The data line 1 is electrically connected to the first pixel electrode 5*a* through the first thin film transistor, and the data line 1 is electrically connected to the second pixel electrode 5*b* through the second thin film transistor. A gate electrode 6*a* of the first thin film transistor and a gate electrode 6*b* of the second thin film transistor are respectively positioned at the two sides of the gate line 2 corresponding to the pixel region and are disposed to be opposite to each other. A gate cutout 3 is disposed in an area of the gate line 2 intersecting the data line 1 along an extending direction of the gate line 2, the gate cutout 3 extends beyond the area where the gate line 2 intersects the data line 1 in a length direction of the gate cutout 3, and the length direction of the gate cutout 3 is consistent with the extending direction of the gate line 2.

Figure 1B:
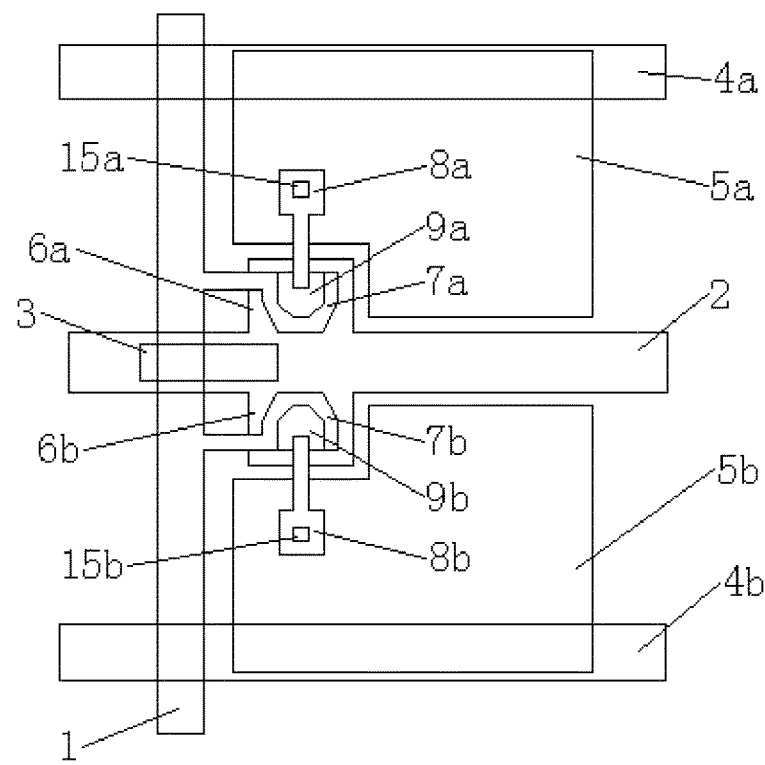
FIG. 1B is another schematic structural view of one pixel region in an array substrate according to a first embodiment of the present disclosure.

FIG. 1B is another schematic structural view of one pixel region in an array substrate according to a first embodiment of the present disclosure. The structure of the pixel region of FIG. 1B differs from the structure of the pixel region of FIG. 1A in that, the gate cutout 3 in FIG. 1B extends beyond the area where the gate line 2 intersects the data line 1 in a length direction of the gate cutout 3, and extends to an area between the gate electrode 6*a* of the first thin film transistor and the gate electrode 6*b* of the second thin film transistor. The gate cutout 3 is thus disposed to reduce the coupling capacitance between the gate line 2 and the data line 1, and further contribute to reducing the interference between the first thin film transistor and the second thin film transistor.

In particular, the data line 1 and the gate line 2 may be formed of a conductive material comprising Cu, Al, Mo, Ti, Cr or W, and of course, may be formed of an alloy of the above materials. In one embodiment, the gate line 2 may have a single layer structure or a multilayer structure such as a multilayer structure of Mo/Al/Mo, a multilayer structure of Ti/Cu/Ti or a multilayer structure of Mo/Ti/Cu.

The width of the gate cutout 3 is smaller than that of the gate line 2, such that the gate line 2 may not be broken due to the configuration of the gate cutout 3. A shape of the gate cutout 3 is preferably rectangular, and other shapes may also be used. The gate line 2 is provided with the gate cutout 3, such that the overlapped area between the gate line 2 and the data line 1 is reduced, and the coupling capacitance between the data line 1 and the gate line 2 can be reduced, thereby reducing crosstalk between the data line 1 and the gate line 2. The width direction of the gate cutout 3 coincides with the extending direction of the data line 1. The width direction of the gate line 2 coincides with the extending direction of the data line 1.

The pixel region of this array substrate further comprises two storage electrode lines, i.e., a first storage electrode line 4*a* and a second storage electrode line 4*b*, respectively. The first storage electrode line 4*a* and the second storage electrode line 4*b* are at least partially overlapped with orthographic projections of the first pixel electrode 5*a* and the second pixel electrode 5*b* on the substrate 14, respectively.

In particular, the first storage electrode line 4*a* and the second storage electrode line 4*b* are disposed to be parallel to the gate line 2, respectively. Further, the first storage electrode line 4*a* and the second storage electrode line 4*b* are disposed in a same layer as the gate line 2, the first storage electrode line 4*a* is at least partially overlapped with an orthographic projection of the first pixel electrode 5*a* on the substrate 14, and the second storage electrode line 4*b* is at least partially overlapped with an orthographic projection of the second pixel electrode 5*b* on the substrate 14.

When the above array substrate is used to form a display device, when the voltages of the first storage electrode line 4*a* and the second storage electrode line 4*b* in the same pixel region are respectively controlled, the first pixel electrode 5*a* and the second pixel electrode 5*b* may generate different voltages due to the storage capacitance between the first storage electrode line 4*a* and the first pixel electrode 5*a* and the storage capacitance between the second storage electrode line 4*b* and the second pixel electrode 5*b*. That is, the first pixel electrode 5*a* and the second pixel electrode 5*b* drive respective liquid crystals with different voltages, which may compensate the display viewing angle of the entire array substrate and improves the color bias defect.

The gate electrode 6*a* of the first thin film transistor and the gate electrode 6*b* of the second thin film transistor are disposed in a same layer, and are electrically connected to the gate line 2 corresponding to the pixel region, respectively. A source electrode 7*a* of the first thin film transistor and a source electrode 7*b* of the second thin film transistor are disposed in a same layer, and are electrically connected to the same data line 1. A drain electrode 8*a* of the first thin film transistor and a drain electrode 8*b* of the second thin film transistor are disposed in a same layer, the drain electrode 8*a* of the first thin film transistor is electrically connected with the first pixel electrode 5*a* through a first via 15*a* on a passivation layer 11, and the drain electrode 8*b* of the second thin film transistor is electrically connected with the second pixel electrode 5*b* through a second via 15*b* on the passivation layer 11.

An active layer 9a of the first thin film transistor and an active layer 9b of the second thin film transistor are disposed in a same layer.

A gate insulating layer 10 is disposed between the gate electrode 6a of the first thin film transistor and an active layer 9 (comprising the active layer 9a of the first thin film transistor and the active layer 9b of the second thin film transistor), and between the gate electrode 6b of the second thin film transistor and the active layer 9. The gate insulating layer 10 is made of silicon oxide or silicon nitride. The gate insulating layer 10 may be a single layer structure or a multilayer structure such as a multilayer structure of silicon oxide/silicon nitride. Meanwhile, since the gate insulating layer 10 is formed over the gate line 2, the material of the gate insulating layer 10 will be filled in the gate cutout 3 during the manufacturing process. In addition, the active layer 9 may be prepared using any of amorphous silicon, poly silicon, microcrystalline silicon, and oxide semiconductor.

The passivation layer 11 is disposed between the first thin film transistor and the first pixel electrode 5a in the pixel region, and between the second thin film transistor and the second pixel electrode 5b in the pixel region. The passivation layer 11 may be prepared using an inorganic material, such as silicon nitride, or may be prepared using an organic material, such as organic resin. That is, the passivation layer 11 is disposed between the source electrode 7a and the drain electrode 8a of the first thin film transistor and the first pixel electrode 5a, and between the source electrode 7b and the drain electrode 8b of the second thin film transistor and the second pixel electrode 5b. In one embodiment, the first pixel electrode 5a and the second pixel electrode 5b in the pixel region are formed of a transparent metal oxide conductive material, and the transparent metal oxide conductive material comprises indium tin oxide (ITO) or indium zinc oxide (IZO).

In the array substrate provided by the present embodiment, since the gate cutout is formed in the area of the gate line intersecting the data line, the overlapped area between the gate line and the data line is reduced, and the coupling capacitance between the data line and the gate line can be reduced, thereby reducing crosstalk between the data line and the gate line, and ensuring uniform image display.

Second Embodiment

The present embodiment provides an array substrate having a structure similar to that of the array substrate of the first embodiment, which differs from the first embodiment in that, the gate cutout disposed in the gate line of the array substrate of the present embodiment extends beyond an area between the gate electrode of the first thin film transistor and the gate electrode of the second thin film transistor in the length direction of the gate cutout.

Figure 3:
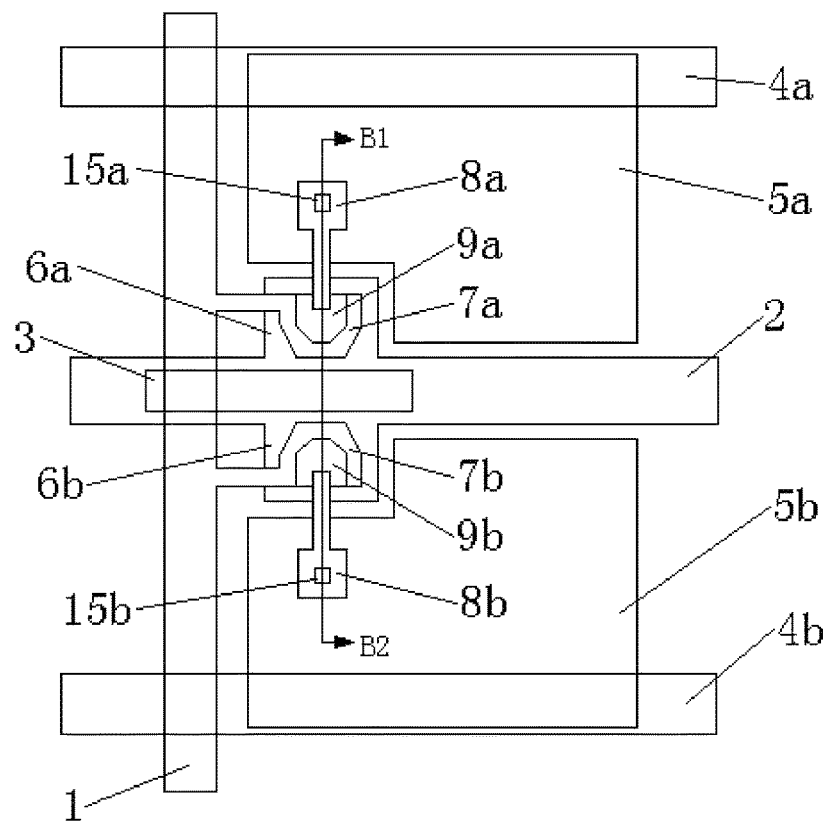
FIG. 3 is a schematic structural view of one pixel region in an array substrate according to a second embodiment of the present disclosure.

FIG. 3 is a schematic structural view of one pixel region in an array substrate according to the present embodiment. As shown in FIG. 3, in the array substrate, a gate cutout 3 is disposed in an area of the gate line 2 intersecting the data line 1 in an extending direction of the gate line 2, and the gate cutout 3 extends beyond an area between the gate electrode of the first thin film transistor and the gate electrode of the second thin film transistor in the length direction. Compared with the first embodiment, the first thin film transistor and the second thin film transistor are separated better.

Figure 4:
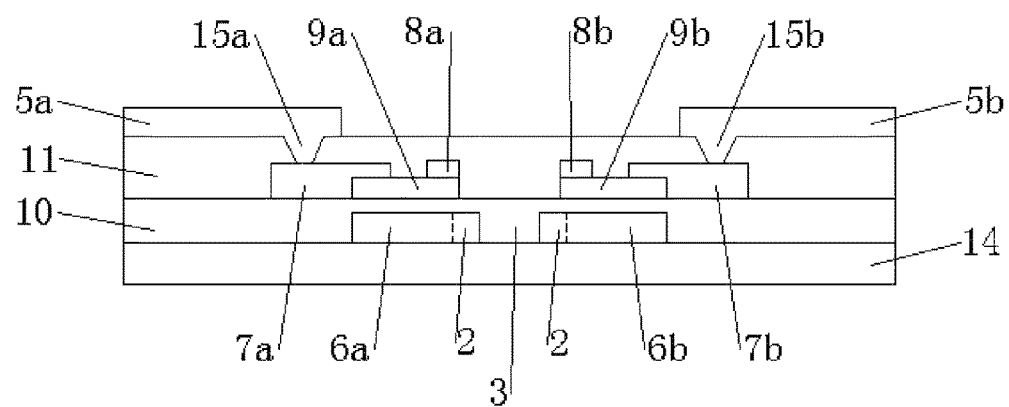
FIG. 4 is a cross-sectional view taken along a line B1-B2 in FIG. 3.

FIG. 4 is a cross-sectional view taken along a line B1-B2 in FIG. 3. As shown in FIG. 4, the gate electrode 6a of the first thin film transistor and the gate electrode 6b of the second thin film transistor are disposed in a same layer, and are electrically connected to a same gate line 2. In one embodiment, the gate electrode 6a of the first thin film transistor and the gate electrode 6b of the second thin film transistor are located in different sides of the gate line 2, the gate cutout 3 is formed in the middle of the gate line 2, and the material of the gate insulating layer 10 is filled in the gate cutout 3.

On the basis of the array substrate of the first embodiment, the array substrate provided in the present embodiment has a gate cutout extending beyond the area between the first thin film transistor and the second thin film transistor, such that the mutual interference between the first thin film transistor and the second thin film transistor can be reduced.

Third Embodiment

The present embodiment provides an array substrate having a structure similar to that of the array substrate of the second embodiment, which differs from the second embodiment in that, the array substrate of the present embodiment has a source connecting line disposed between a source electrode of the first thin film transistor and a source electrode of the second thin film transistor, wherein the source connecting line is electrically connected with the source electrode of the first thin film transistor and the source electrode of the second thin film transistor, and the source connecting line intersects the gate line. In the present embodiment, the length of the source connecting line is not limited. The length of the source connecting line may be greater than a width of the gate line, the length of the source connecting line may also be smaller than the width of the gate line, or the length of the source connecting line may also be equal to the width of the gate line. A length direction of the source connecting line is consistent with the extending direction of the data line.

Figure 5:
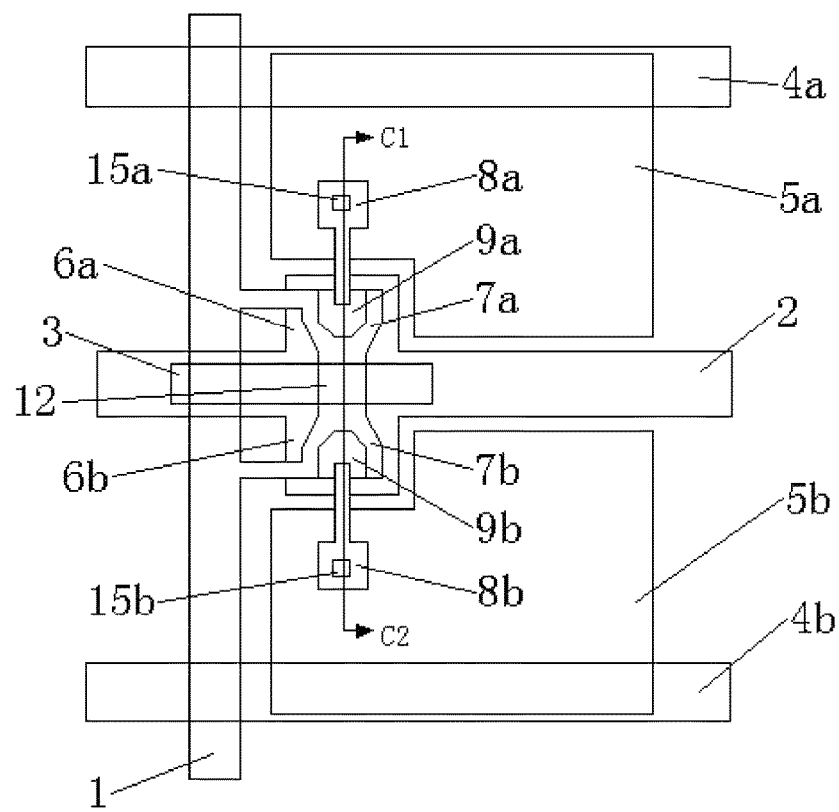
FIG. 5 is a schematic structural view of one pixel region in an array substrate according to a third embodiment of the present disclosure.

FIG. 5 is a schematic structural view of one pixel region in an array substrate according to the present embodiment. As shown in FIG. 5, in the array substrate, a source connecting line 12 is disposed between a source electrode 7a of the first thin film transistor and a source electrode 7b of the second thin film transistor, and the source connecting line 12 intersects the gate line 2, and preferably, the source connecting line 12 is vertically intersected with the gate line 2.

Figure 6:
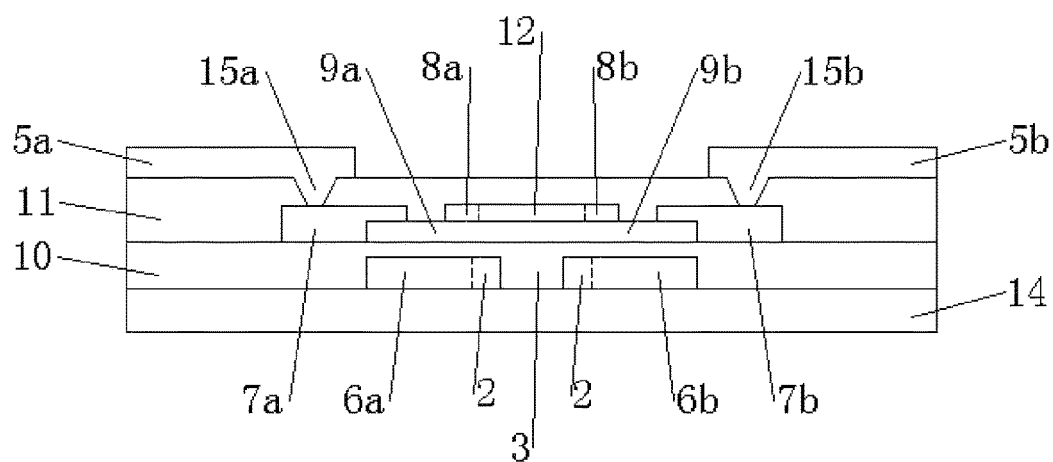
FIG. 6 is a cross-sectional view taken along a line C1-C2 in FIG. 5.

FIG. 6 is a cross-sectional view taken along a line C1-C2 in FIG. 5. As shown in FIG. 6, in the array substrate, the source connecting line 12 is disposed in a same layer as the source electrode 7a of the first thin film transistor and the source electrode 7b of the second thin film transistor. Accordingly, the active layer 9a of the first thin film transistor and the active layer 9b of the second thin film transistor are disposed in a same layer and connected with each other.

On the basis of the array substrate of the second embodiment, the array substrate provided in the present embodiment can maintain the voltage of the source electrode of the first thin film transistor to be coincident with the voltage of the source electrode of the second thin film transistor at all times by configuring the source connecting line to electrically connect the source electrode of the first thin film transistor with the source electrode of the second thin film transistor, so as to ensure the consistency of driving of the first thin film transistor and the second thin film transistor.

Fourth Embodiment

The present embodiment provides an array substrate having a structure similar to that of the array substrate of the third embodiment, which differs from the third embodiment in that, the array substrate of the present embodiment has a source connecting line provided with a source cutout, and the source cutout is located inside the source connecting line. In one embodiment, the source cutout is located in the area where the source connecting line intersects the gate line. In the present embodiment, the area where the source connecting line intersects the gate line comprises areas where the source connecting line and the source cutout intersect the gate line and the gate cutout, respectively.

Figure 7:
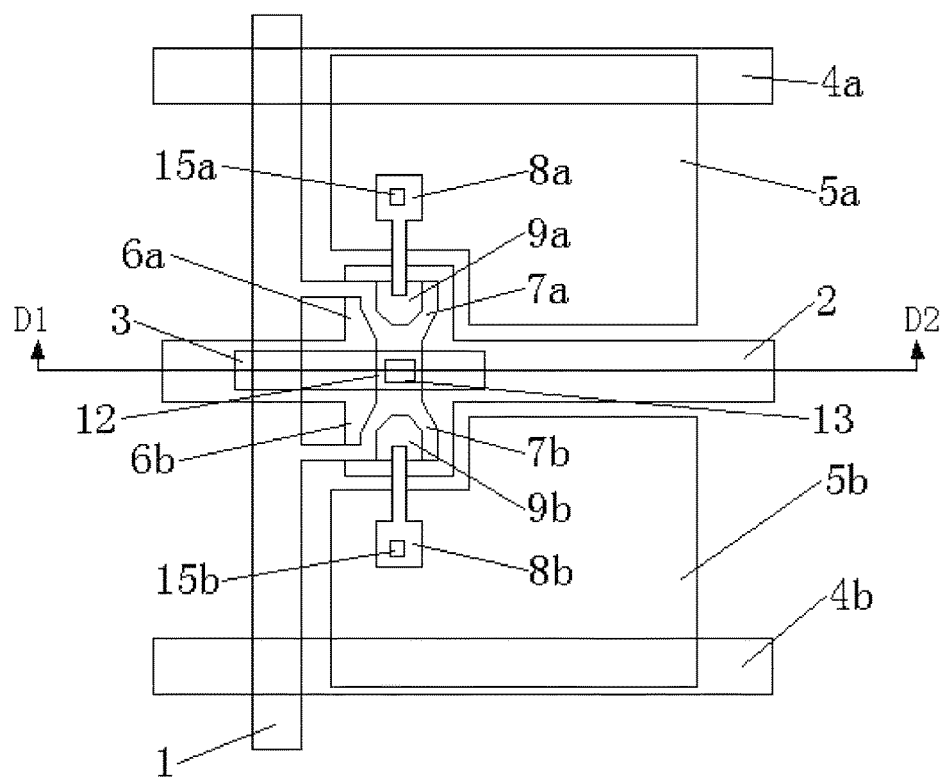
FIG. 7 is a schematic structural view of one pixel region in an array substrate according to a fourth embodiment of the present disclosure.
Figure 8:
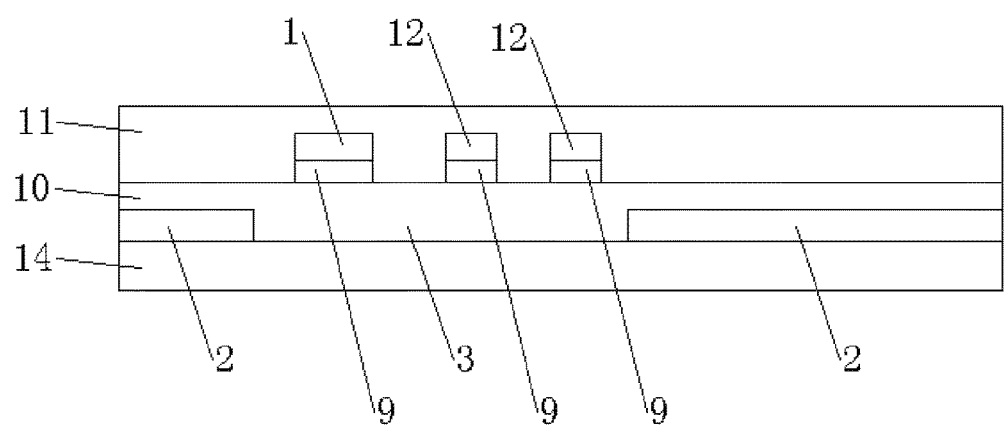
FIG. 8 is a cross-sectional view taken along a line D1-D2 in FIG. 7.

FIG. 7 is a schematic structural view of one pixel region in an array substrate according to the present embodiment, and FIG. 8 is a cross-sectional view taken along a line D1-D2 in FIG. 7. As shown in FIGS. 7 and 8, in the array substrate, the gate cutout 3 extends beyond an area between the gate electrode 6a of the first thin film transistor and the gate electrode 6b of the second thin film transistor. A source cutout 13 is formed in an area where the source connecting line 12 intersects the gate cutout 3, and an orthographic projection of the source cutout 13 on the substrate 14 is within an orthographic projection of the gate cutout 3 on the substrate 14. Thus, the area of the overlapped region of the source connecting line 12 and the gate line 2 may be reduced, thereby reducing the coupling capacitance between the source connecting line and the gate line.

Further, a width of the source cutout 13 is smaller than that of the source connecting line 12, to ensure that the source connecting line 12 may not be broken due to the configuration of the source cutout 13. The shape of the source cutout 13 is preferably square, and of course other shapes may be used. The width directions of the source connecting line 12 and the source cutout 13 coincide with the extending direction of the gate line 2.

On the basis of the array substrate of the third embodiment, the array substrate provided in the present embodiment is provided with a source cutout in the area where the source connecting line intersects with the gate line, thus the coupling capacitance between the source connecting line and the gate line can be reduced, thereby reducing the crosstalk between the source connecting line and the gate line.

Fifth Embodiment

The present embodiment provides an array substrate having a structure similar to that of the array substrate of the fourth embodiment, which differs from the fourth embodiment in that, the array substrate of the present embodiment has a source connecting line formed with a source cutout, and the source cutout is located at one side of the source connecting line. In one embodiment, the source cutout is located in the area where the source connecting line intersects the gate line. In the present embodiment, the area where the source connecting line intersects the gate line comprises areas where the source connecting line and the source cutout intersect the gate line and the gate cutout, respectively.

Figure 9:
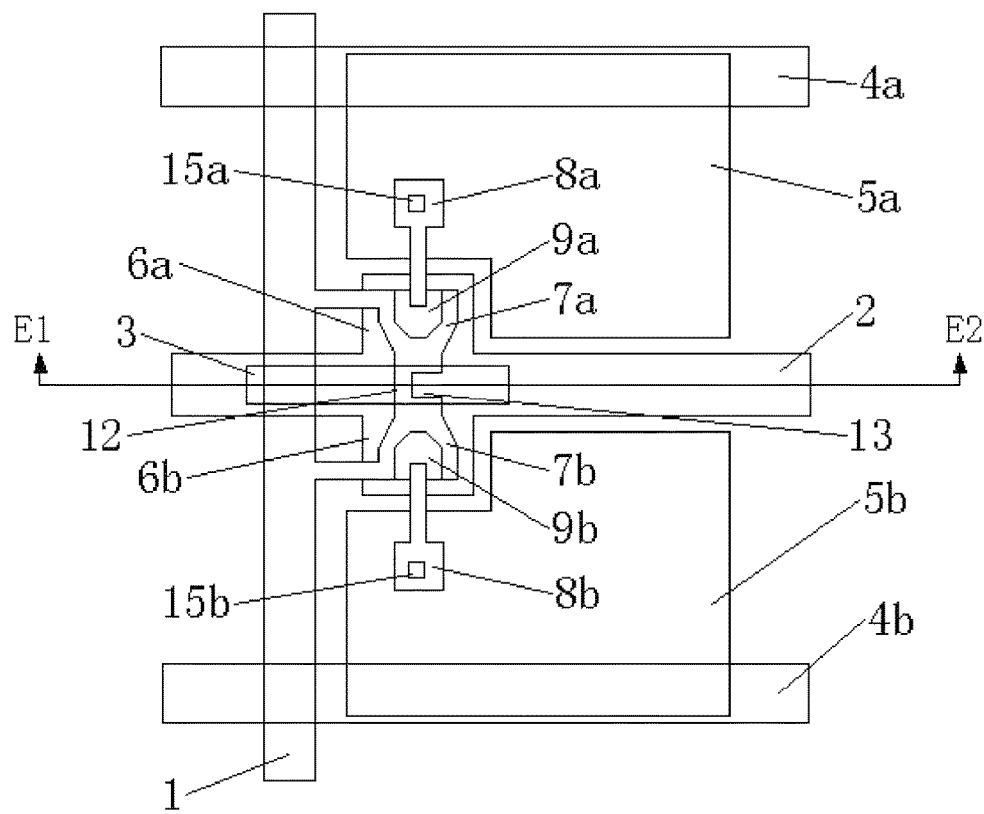
FIG. 9 is a schematic structural view of one pixel region in an array substrate according to a fifth embodiment of the present disclosure.
Figure 10:
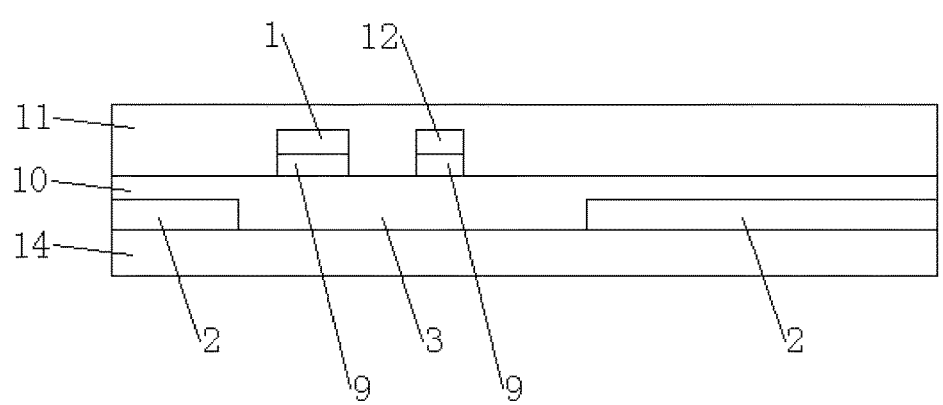
FIG. 10 is a cross-sectional view taken along a line E1-E2 in FIG. 9.

FIG. 9 is a schematic structural view of one pixel region in an array substrate according to the present embodiment, and FIG. 10 is a cross-sectional view taken along a line E1-E2 in FIG. 9. As shown in FIGS. 9 and 10, in the array substrate, the gate cutout 3 extends beyond the area between the gate electrode 6a of the first thin film transistor and the gate electrode 6b of the second thin film transistor. An area where one side of the source connecting line 12 intersects the gate cutout 3 is formed with a source cutout 13, and an orthographic projection of the source cutout 13 on the substrate 14 is within an orthographic projection of the gate cutout 3 on the substrate 14.

The array substrate provided in the present embodiment can achieve the same effect as the array substrate of the fourth embodiment.

Sixth Embodiment

Figure 11:
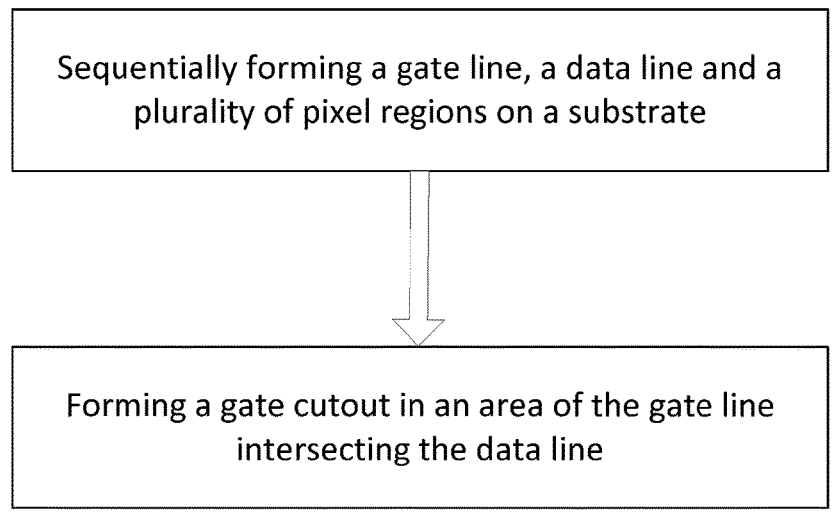
FIG. 11 is a flow chart of a manufacturing method of an array substrate according to a sixth embodiment of the present disclosure.

The present embodiment provides a manufacturing method of the array substrate of any one of the above embodiments. As shown in FIG. 11, the manufacturing method comprises a step of sequentially forming a gate line, a data line and a plurality of pixel regions on a substrate. A first pixel electrode and a second pixel electrode are disposed in the pixel region, and the first pixel electrode and the second pixel electrode are oppositely disposed at two sides of the gate line corresponding to the pixel region and are electrically insulated from each other. A first thin film transistor and a second thin film transistor are also disposed in the pixel region, the data line is electrically connected to the first pixel electrode through the first thin film transistor, the data line is electrically connected to the second pixel electrode through the second thin film transistor, a gate electrode of the first thin film transistor and a gate electrode of the second thin film transistor are respectively positioned at the two sides of the gate line corresponding to the pixel region and are disposed to be opposite to each other.

The manufacturing method of the array substrate further comprises a step of forming a gate cutout in an area of the gate line intersecting the data line.

In one embodiment, the step of forming the gate cutout further comprises: forming the gate cutout along an extending direction of the gate line, the gate cutout being formed to at least extend beyond the area where the gate line intersects the data line in a length direction of the gate cutout.

In one embodiment, the step of forming the gate cutout further comprises: forming the gate cutout having a width smaller than a width of the gate line.

In one embodiment, the step of forming the gate cutout further comprises: forming the gate cutout along an extending direction of the gate line, the gate cutout being formed to extend beyond an area between the gate electrode of the first thin film transistor and the gate electrode of the second thin film transistor in a length direction of the gate cutout.

In one embodiment, a source electrode of the first thin film transistor and a source electrode of the second thin film transistor are disposed in a same layer, wherein the manufacturing method further comprises a step of:

forming a source connecting line between the source electrode of the first thin film transistor and the source electrode of the second thin film transistor, wherein the source connecting line is electrically connected with the source electrode of the first thin film transistor and the source electrode of the second thin film transistor, respectively, and the source connecting line intersects the gate line.

In one embodiment, the manufacturing method further comprises: forming a source cutout in the source connecting line, wherein the source cutout is positioned inside the source connecting line, or the source cutout is positioned at one side of the source connecting line.

In one embodiment, the gate cutout extends beyond the area between the gate electrode of the first thin film transistor and the gate electrode of the second thin film transistor in the length direction of the gate cutout, and the source cutout is located in the area where the source connecting line intersects the gate line.

In one embodiment, the gate cutout is formed to extend beyond the area between the gate electrode of the first thin film transistor and the gate electrode of the second thin film transistor in the length direction of the gate cutout, and an orthographic projection of the source cutout on the substrate is within an orthographic projection of the gate cutout on the substrate.

In the manufacturing method of the array substrate provided by the present embodiment, since the gate cutout is formed on the gate line in the area where the gate line intersects the data line, the area of the overlapped region of the data line and the gate line can be reduced, and the coupling capacitance between the data line and the gate line can be reduced, thereby reducing crosstalk between the data line and the gate line, and ensuring uniform image display. Since the gate cutout is formed to extend beyond the area between the first thin film transistor and the second thin film transistor, the mutual interference between the first thin film transistor and the second thin film transistor can be reduced. Since the source connecting line is configured to electrically connect the source electrode of the first thin film transistor with the source electrode of the second thin film transistor, the voltage of the source electrode of the first thin film transistor can be maintained to be constantly coincident with the voltage of the source electrode of the second thin film transistor, so as to ensure the consistency of driving of the first thin film transistor and the second thin film transistor. Since the source cutout is disposed in the area where the source connecting line intersects the gate line, the coupling capacitance between the source connecting line and the gate line can be reduced, thereby reducing crosstalk between the source connecting line and the gate line.

Seventh Embodiment

The present embodiment provides a display device comprising the array substrate of any one of the first to the fifth embodiments.

The display device may be any product or component having a display function such as a liquid crystal display panel, an electronic paper, a mobile phone, a tablet computer, a television set, a monitor, a notebook computer, a digital photo frame, a navigator, or the like.

The display device of the present embodiment can reduce the area of the overlapped region of the data line and the gate line and reduce the coupling capacitance between the data line and the gate line, thereby reducing crosstalk between the data line and the gate line, and ensuring uniform image display.

It is to be understood that the above implementations are merely exemplary implementations employed for the purpose of illustrating the principles of the present disclosure, but the present disclosure is not limited thereto. It will be apparent to those skilled in the art that various modifications and improvements can be made therein without departing from the spirit and substance of the present disclosure, and such modifications and improvements are also regarded to be within the protection scope of the present disclosure.

What is claimed is:

1. An array substrate comprising a substrate, a gate line, a data line and a plurality of pixel regions, wherein a first pixel electrode and a second pixel electrode are disposed in the pixel region, and the first pixel electrode and the second pixel electrode are oppositely disposed at two sides of the gate line corresponding to the pixel region and are electrically insulated from each other;

a first thin film transistor and a second thin film transistor are also disposed in the pixel region, the data line is electrically connected to the first pixel electrode through the first thin film transistor, the data line is electrically connected to the second pixel electrode through the second thin film transistor, a gate electrode of the first thin film transistor and a gate electrode of the second thin film transistor are respectively positioned at the two sides of the gate line corresponding to the pixel region and are disposed to be opposite to each other, and a gate cutout is disposed in an area of the gate line intersecting the data line, wherein a source electrode of the first thin film transistor and a source electrode of the second thin film transistor are disposed in a same layer, a source connecting line is disposed between the source electrode of the first thin film transistor and the source electrode of the second thin film transistor, the source connecting line is electrically connected with the source electrode of the first thin film transistor and the source electrode of the second thin film transistor, respectively, and the source connecting line intersects the gate line, and wherein the source connecting line is provided with a source cutout, and the source cutout is positioned inside the source connecting line.

2. The array substrate of claim 1, wherein the gate cutout is formed along an extending direction of the gate line, and the gate cutout at least extends beyond the area where the gate line intersects the data line in a length direction of the gate cutout.

3. The array substrate of claim 1, wherein the gate cutout is formed along an extending direction of the gate line, and the gate cutout extends beyond an area between the gate electrode of the first thin film transistor and the gate electrode of the second thin film transistor in a length direction of the gate cutout.

4. The array substrate of claim 1, wherein the pixel region further comprises a first storage electrode line and a second storage electrode line, an orthographic projection of the first storage electrode line on the substrate is at least partially overlapped with an orthographic projection of the first pixel electrode on the substrate, and an orthographic projection of the second storage electrode line on the substrate is at least partially overlapped with an orthographic projection of the second pixel electrode on the substrate.

5. The array substrate of claim 1, wherein the gate electrode of the first thin film transistor and the gate electrode of the second thin film transistor are disposed in a same layer, and are electrically connected to the gate line corresponding to the pixel region, respectively.

6. The array substrate of claim 1, wherein the gate cutout extends beyond an area between the gate electrode of the first thin film transistor and the gate electrode of the second thin film transistor in a length direction of the gate cutout, and the source cutout is positioned in an area where the source connecting line intersects the gate line.

7. The array substrate of claim 1, wherein the gate cutout extends beyond an area between the gate electrode of the first thin film transistor and the gate electrode of the second thin film transistor in a length direction of the gate cutout, and an orthographic projection of the source cutout on the substrate is within an orthographic projection of the gate cutout on the substrate.

8. The array substrate of claim 1, wherein a drain electrode of the first thin film transistor and a drain electrode of the second thin film transistor are disposed in a same layer, the drain electrode of the first thin film transistor is electrically connected with the first pixel electrode, and the drain electrode of the second thin film transistor is electrically connected with the second pixel electrode.

9. A display device, comprising the array substrate of claim 1.

10. A manufacturing method of an array substrate, comprising a step of sequentially forming a gate line, a data line and a plurality of pixel regions on a substrate, wherein a first pixel electrode and a second pixel electrode are disposed in the pixel region, and the first pixel electrode and the second pixel electrode are oppositely disposed at two sides of the gate line corresponding to the pixel region and are electrically insulated from each other; a first thin film transistor and a second thin film transistor are also disposed in the pixel region, the data line is electrically connected to the first pixel electrode through the first thin film transistor, the data line is electrically connected to the second pixel electrode through the second thin film transistor, a gate electrode of the first thin film transistor and a gate electrode of the second thin film transistor are respectively positioned at the two sides of the gate line corresponding to the pixel region and are disposed to be opposite to each other, wherein, the manufacturing method of the array substrate further comprises a step of:

forming a gate cutout in an area of the gate line intersecting the data line, wherein a source electrode of the first thin film transistor and a source electrode of the second thin film transistor are disposed in a same layer, wherein the manufacturing method further comprises a step of:

forming a source connecting line between the source electrode of the first thin film transistor and the source electrode of the second thin film transistor, the source connecting line being electrically connected with the source electrode of the first thin film transistor and the source electrode of the second thin film transistor, respectively, and the source connecting line intersecting the gate line; and forming a source cutout in the source connecting line, wherein the source cutout is positioned inside the source connecting line.

11. The manufacturing method of claim 10, wherein the step of forming the gate cutout further comprises:

forming the gate cutout along an extending direction of the gate line, the gate cutout being formed to at least extend beyond the area where the gate line intersects the data line in a length direction of the gate cutout.

12. The manufacturing method of claim 10, wherein the step of forming the gate cutout further comprises:

forming the gate cutout along an extending direction of the gate line, the gate cutout being formed to extend beyond an area between the gate electrode of the first thin film transistor and the gate electrode of the second thin film transistor in a length direction of the gate cutout.

13. The manufacturing method of claim 10, wherein the gate cutout is formed to extend beyond an area between the gate electrode of the first thin film transistor and the gate electrode of the second thin film transistor in a length direction of the gate cutout, and the source cutout is positioned in an area where the source connecting line intersects the gate line.

14. The manufacturing method of claim 10, wherein the gate cutout is formed to extend beyond an area between the gate electrode of the first thin film transistor and the gate electrode of the second thin film transistor in a length direction of the gate cutout, and an orthographic projection of the source cutout on the substrate is within an orthographic projection of the gate cutout on the substrate.

* * * * *